(12) United States Patent
Anderson et al.

(10) Patent No.: US 8,492,845 B2
(45) Date of Patent: Jul. 23, 2013

(54) GATE-TO-GATE RECESSED STRAP AND METHODS OF MANUFACTURE OF SAME

(75) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 12/940,210

(22) Filed: Nov. 5, 2010

(65) Prior Publication Data

US 2012/0112287 A1 May 10, 2012

(51) Int. Cl.
H01L 27/88 (2006.01)

(52) U.S. Cl.
USPC ........... 257/368; 257/330; 257/331; 257/332; 257/E27.06; 257/E21.628; 438/296

(58) Field of Classification Search
USPC .................... 257/368, 330, 331, 332, E27.06, 257/E21.628; 438/296
See application file for complete search history.

(56) References Cited

U.S. PATENT DOCUMENTS

| | | | |
|---|---|---|---|
| 6,184,091 B1 | 2/2001 | Gruening et al. | |
| 6,677,205 B2 | 1/2004 | Beintner | |
| 6,828,191 B1 | 12/2004 | Wurster et al. | |
| 7,015,092 B2 | 3/2006 | Jaiprakash et al. | |
| 7,015,145 B2 | 3/2006 | Jaiprakash et al. | |
| 7,285,812 B2 | 10/2007 | Tang et al. | |
| 2001/0018247 A1 | 8/2001 | Furukawa et al. | |
| 2007/0262395 A1* | 11/2007 | Gibbons et al. | 257/392 |
| 2007/0264771 A1* | 11/2007 | Ananthan et al. | 438/243 |

* cited by examiner

*Primary Examiner* — Marc Armand
(74) *Attorney, Agent, or Firm* — Schmeiser, Olsen & Watts; Michael J. LeStrange

(57) ABSTRACT

A structure and methods of making the structure. The structure includes: first and a second semiconductor regions in a semiconductor substrate and separated by a region of trench isolation in the substrate; a first gate electrode extending over the first semiconductor region and the region of the trench isolation; a second gate electrode extending over the second silicon region and the region of the trench isolation; a trench in the trench isolation; and a strap in the trench connecting the first and second gate electrodes.

20 Claims, 14 Drawing Sheets

GATE-TO-GATE RECESSED STRAP AND METHODS OF MANUFACTURE OF SAME

FIELD OF THE INVENTION

The present invention relates to the field of semiconductor devices; more specifically, it relates to MOSFET gate-to-gate interconnections and methods of fabricating MOSFET gate-to-gate interconnections.

BACKGROUND

As the dimensions of integrated circuits decrease, lithographic constraints are tending toward the gates of field effect transistors (FETs) to be orientated in a single direction on a fixed pitch. This adds to an increase in the density of the wiring at the next level used to interconnect gates of two or more FETs which are also constrained by lithography. Accordingly, there exists a need in the art to mitigate the deficiencies and limitations described hereinabove.

SUMMARY

A first aspect of the present invention is a structure, comprising: first and second semiconductor regions in a semiconductor substrate and separated by a region of trench isolation in the substrate; a first gate electrode extending over the first semiconductor region and the region of the trench isolation; a second gate electrode extending over the second silicon region and the region of the trench isolation; a trench in the trench isolation; and a strap in the trench connecting the first and second gate electrodes.

A second aspect of the present invention is a method, comprising: forming first and second semiconductor regions in a semiconductor substrate and separated by a region of trench isolation in the substrate; forming a trench in the trench isolation; and forming a first gate electrode extending over the first semiconductor region and the region of the trench isolation, an integral second gate electrode extending over the second silicon region and the region of the trench isolation, and an integral strap in the trench, the strap connecting the first and second gate electrodes.

A third aspect of the present invention is a method comprising: forming first and second semiconductor regions in a semiconductor substrate and separated by a region of trench isolation in the substrate; forming a first trench in the trench isolation; forming a dummy structure comprising a first dummy gate electrode extending over the first semiconductor region and the region of the trench isolation, an integral second dummy gate electrode extending over the second silicon region and the region of the trench isolation, and an integral dummy strap in the first trench, the dummy strap connecting the first and second dummy gate electrodes; and removing the dummy structure and replacing the dummy structure with a first gate electrode, an integral second gate electrode and an integral dummy strap.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
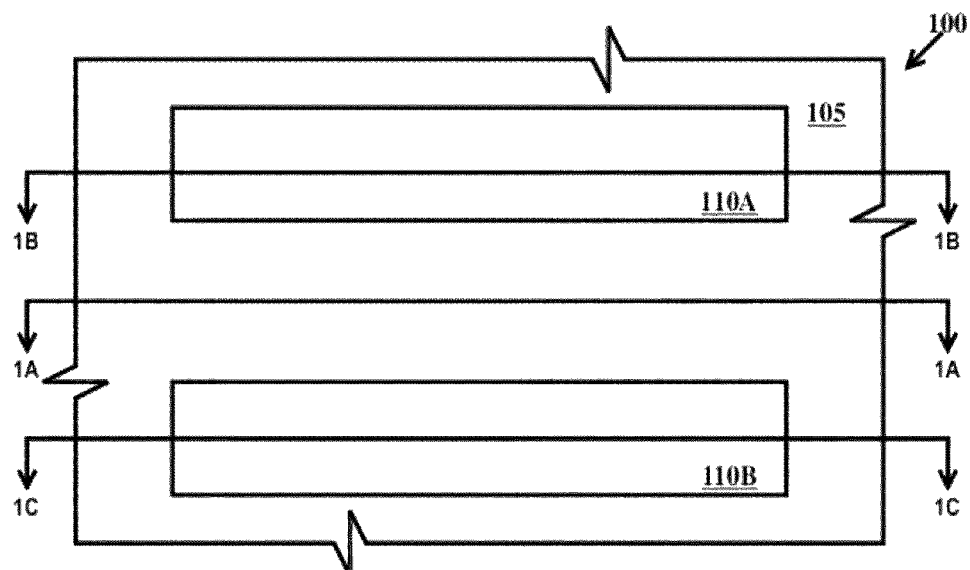
FIGS. 1 through 8 illustrate a first method of fabricating a gate-to-gate strap according to an embodiment of the present invention.
Figure 1A:
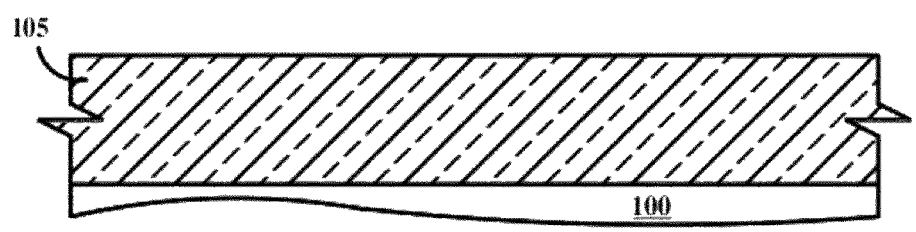
Figure 1B:
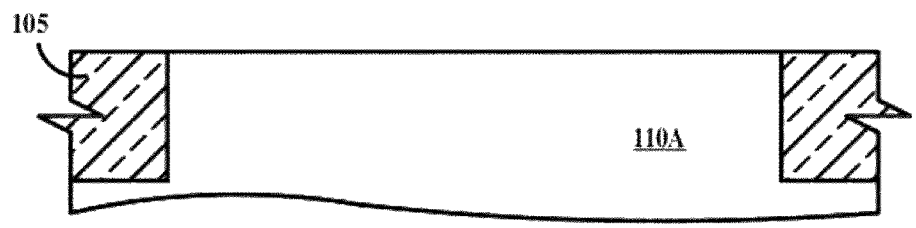

FIGS. 1 through 8 illustrate a first method of fabricating a gate-to-gate strap according to an embodiment of the present invention. FIG. 1 is a plan view and FIGS. 1A and 1B are cross-sectional views through lines 1A-1A and 1B-1B respectively of FIG. 1. A cross-section through line 1C-1C would be similar to FIG. 1B. Formed in a semiconductor substrate 100 (or a semiconductor layer of semiconductor-on-insulator (SOI) substrate) is trench isolation 105 surrounding the perimeters of substrate regions 110A and 110B. In one example, semiconductor substrate is a single-crystal silicon substrate (or semiconductor layer is a single-crystal silicon layer of an SOI substrate). Trench isolation may be formed by etching a trench into the substrate, depositing a dielectric material (e.g., silicon dioxide ($SiO_2$)) to overfill the trench and cover the surface of substrate, followed by a chemical-mechanical-polish (CMP) to coplanarize the top surfaces of the substrate and the dielectric material in the trench.

Figure 2:
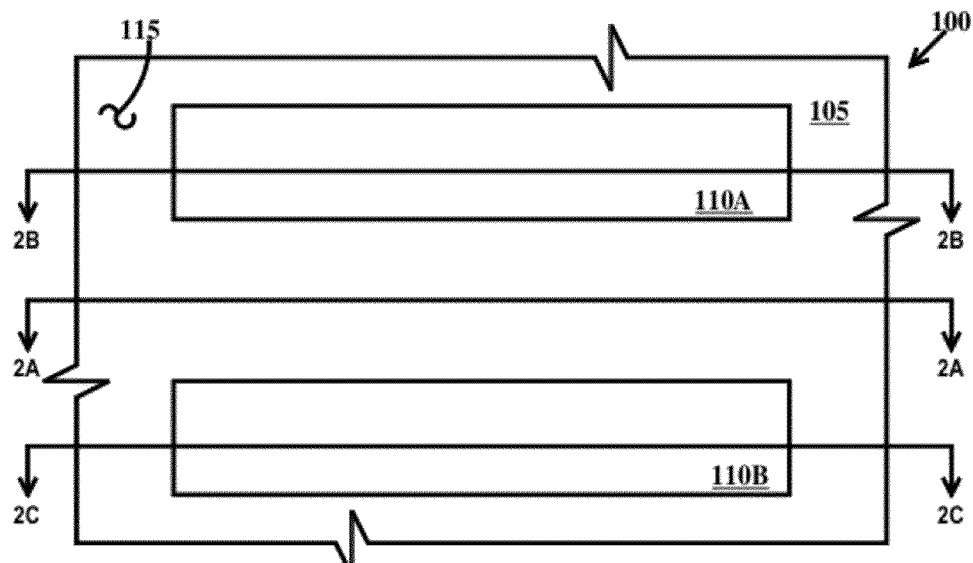
Figure 2A:
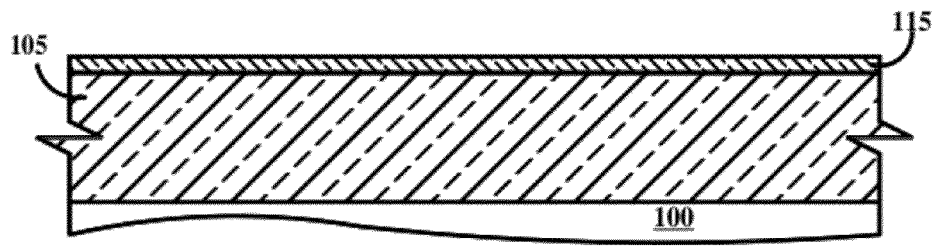
Figure 2B:
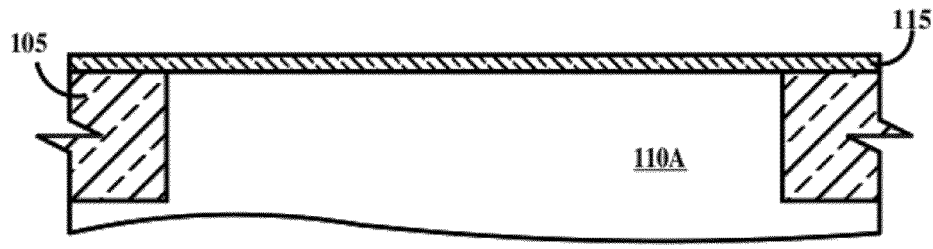

FIG. 2 is a plan view and FIGS. 2A and 2B are cross-sectional views through lines 2A-2A and 2B-2B respectively of FIG. 2. A cross-section through line 2C-2C would be similar to FIG. 2B. In FIGS. 2, 2A and 2B a gate dielectric layer has been formed on trench isolation 115 and substrate regions 110A and 110B. In one example, gate dielectric layer 115 comprises $SiO_2$, silicon nitride ($Si_3N_4$) or combinations of layers thereof. In one example gate dielectric layer 105 is a high-K (dielectric constant) material, examples of which include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high-K dielectric material has a relative permittivity above about 10. In one example, gate dielectric layer 115 is about 0.5 nm to about 20 nm thick.

Figure 3:
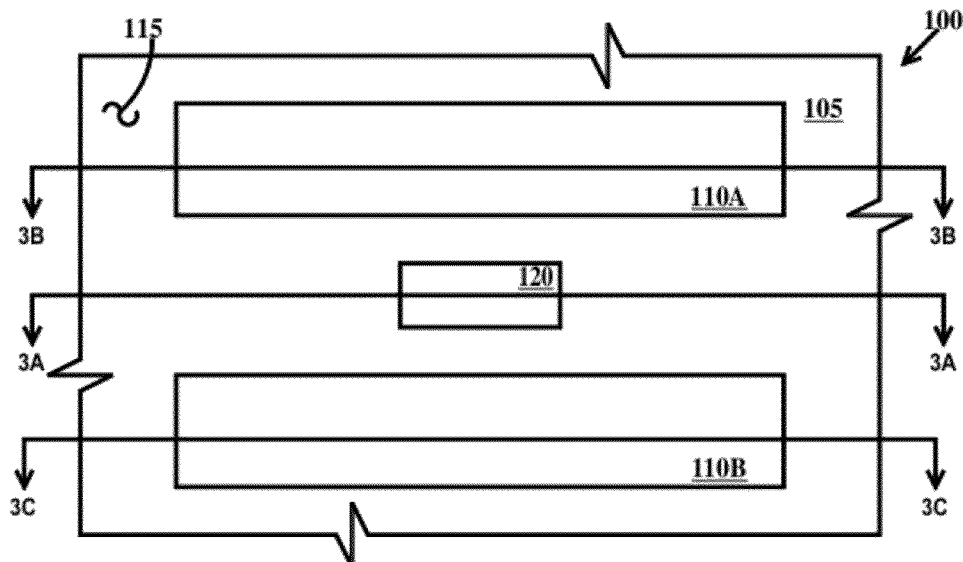
Figure 3A:
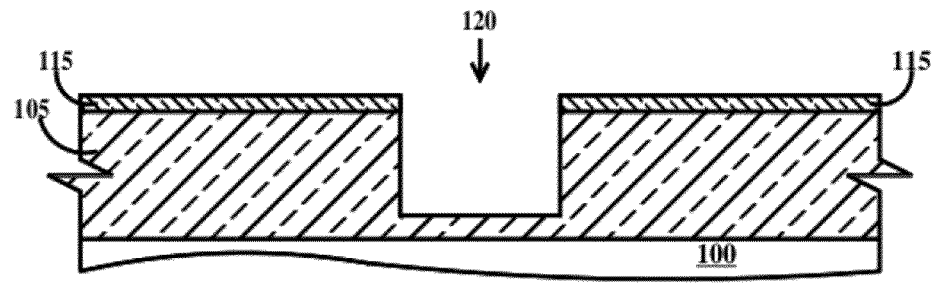
Figure 3B:
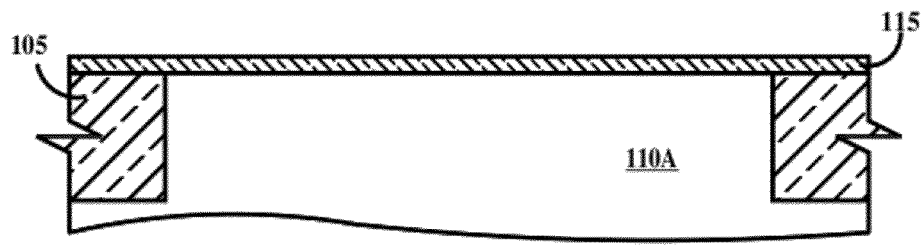

FIG. 3 is a plan view and FIGS. 3A and 3B are cross-sectional views through lines 3A-3A and 3B-3B respectively of FIG. 3. A cross-section through line 3C-3C would be similar to FIG. 3B. In FIGS. 3 and 3A, a trench 120 has been etched in trench isolation 105 through gate dielectric layer 115. Trench 120 is formed by a photolithographic process that forms a patterned photoresist layer on gate dielectric layer 115, followed by a reactive ion etch (RIE), followed by removal of the patterned photoresist layer. Trench 120 is contained within trench isolation 105 and does not extend through the trench isolation to contact underlying substrate 100.

Figure 4:
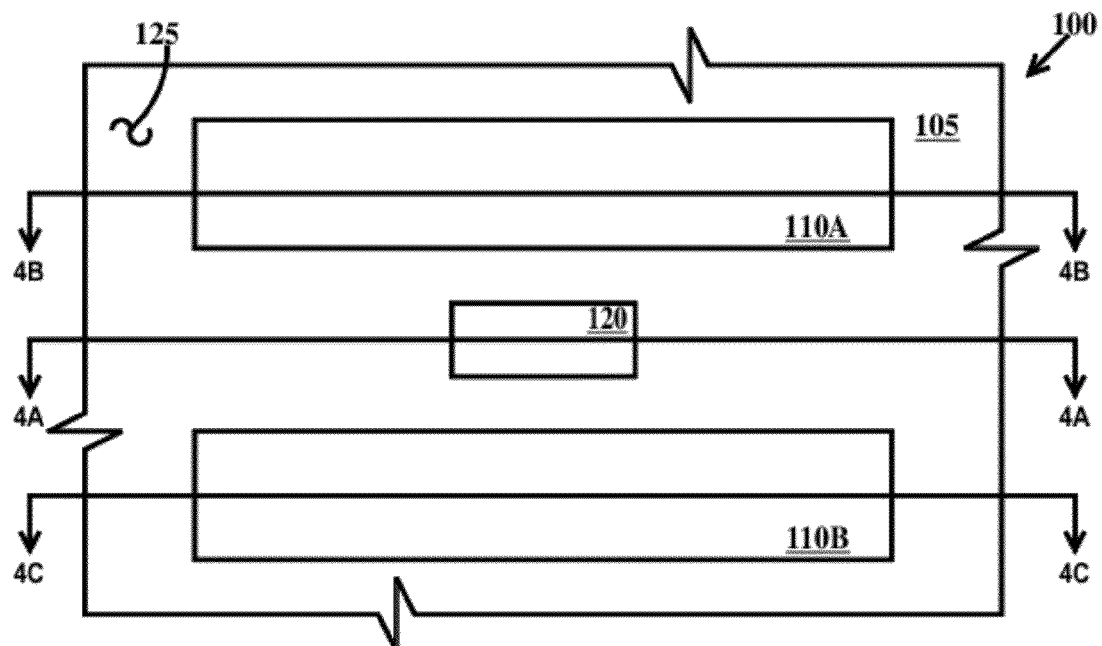
Figure 4A:
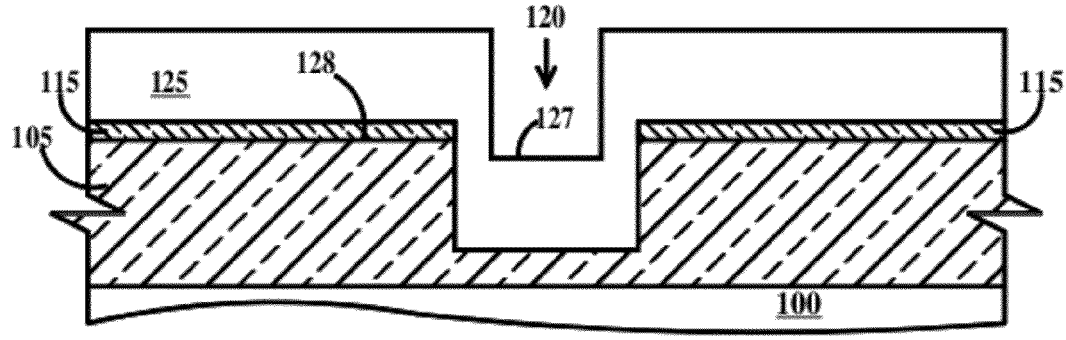
Figure 4B:
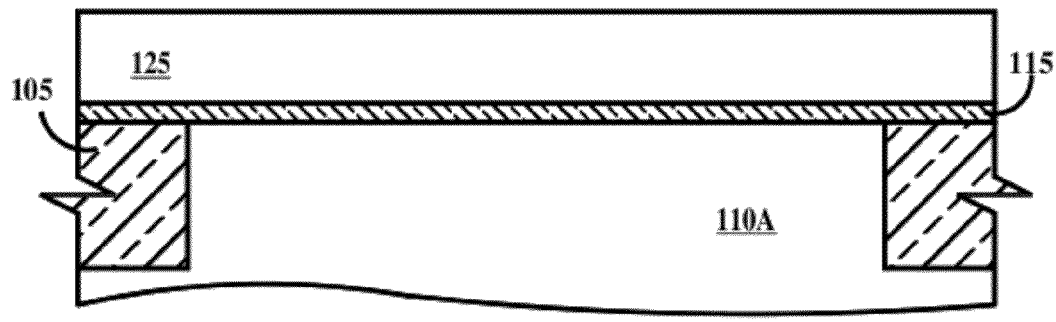

FIG. 4 is a plan view and FIGS. 4A and 4B are cross-sectional views through lines 4A-4A and 4B-4B respectively of FIG. 4. A cross-section through line 4C-4C would be similar to FIG. 4B. In FIGS. 4, 4A and 4B a polysilicon layer 125 has been deposited on substrate 100 and in trench 120. In a preferred embodiment, a top surface 127 of polysilicon layer 125 in trench 120 is recessed below a top surface of 128 of trench isolation 105. Alternatively, top surfaces 127 and 128 may be coplanar or top surface 127 may extend above top surface 128. In one example, polysilicon layer 125 is formed by chemical vapor deposition (CVD).

Figure 5:
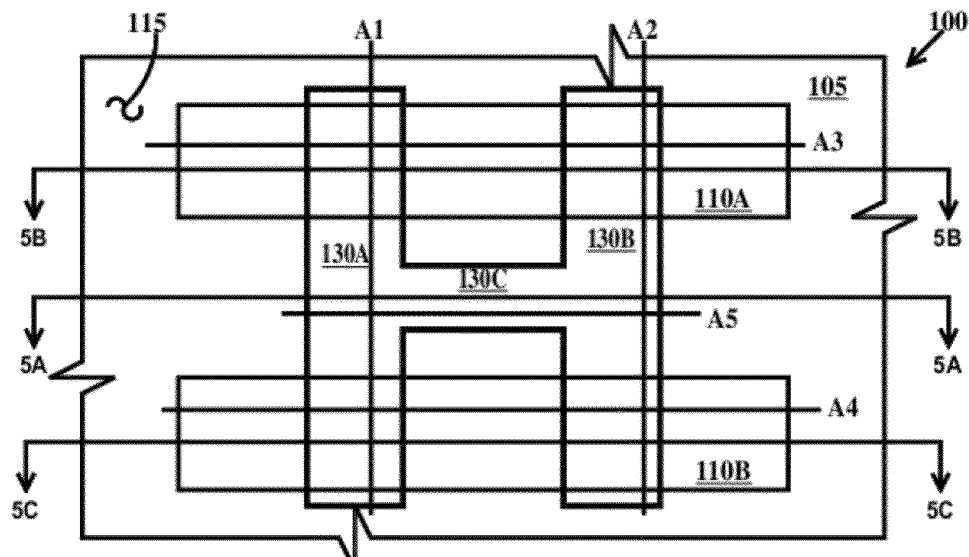
Figure 5A:
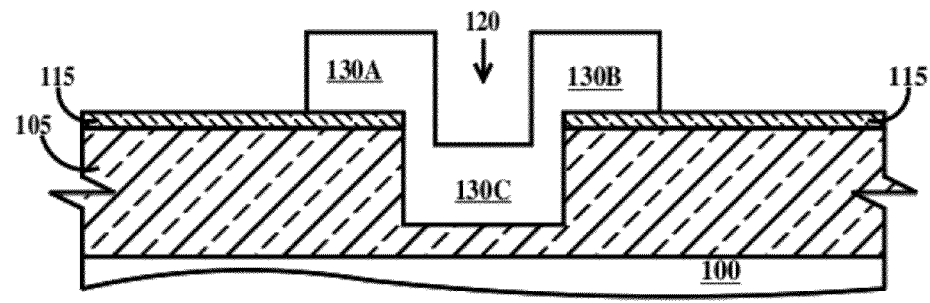
Figure 5B:
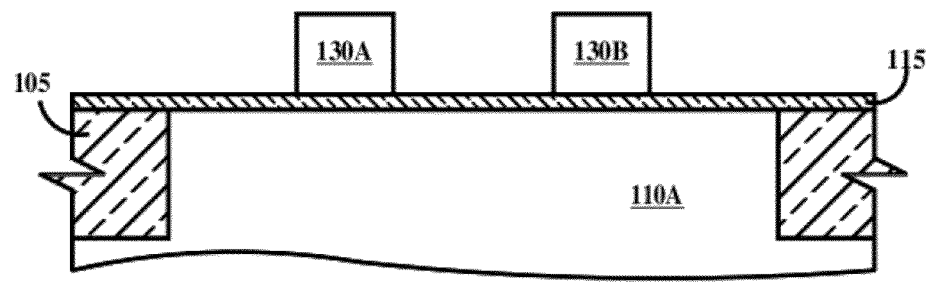

FIG. 5 is a plan view and FIGS. 5A and 5B are cross-sectional views through lines 5A-5A and 5B-5B respectively of FIG. 5. A cross-section through line 5C-5C would be similar to FIG. 5B. In FIGS. 5, 5A and 5B, gate electrodes 130A and 130B connected by a strap 130C have been formed. Gate electrodes 130A and 130B and strap 130C are integrally formed by a photolithographic process that forms a patterned photoresist layer on polysilicon layer 125 (see FIGS. 4, 4A and 4B), followed by a reactive ion etch (RIE), followed by removal of the patterned photoresist layer. Strap 130C is recessed into trench 120.

In FIG. 5, first major axes A1 of gate electrode 130A and A2 of second gate electrode 130B are parallel. Second major axes A3 of first semiconductor region 110A and A4 of second semiconductor region 110B and A5 of strap 130C are parallel. Major axes A1 and A2 are perpendicular to major axes A3, A4 and A5.

Figure 6:
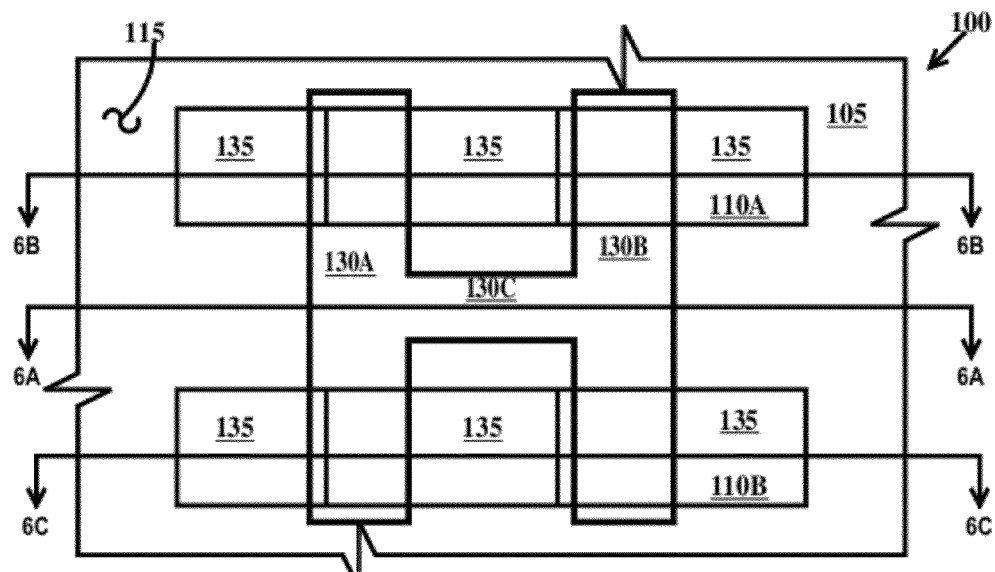
Figure 6A:
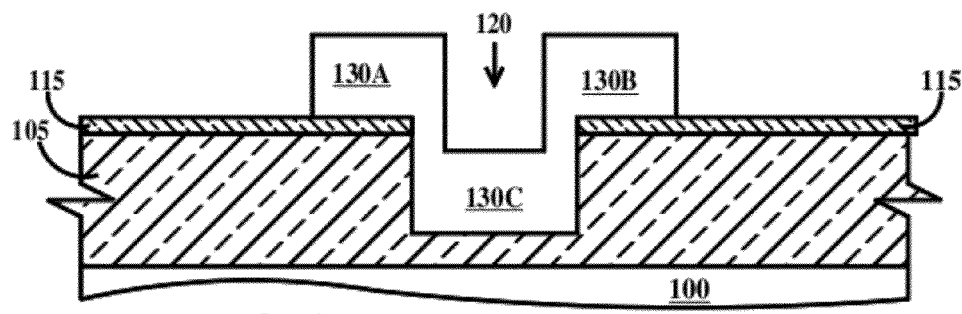
Figure 6B:
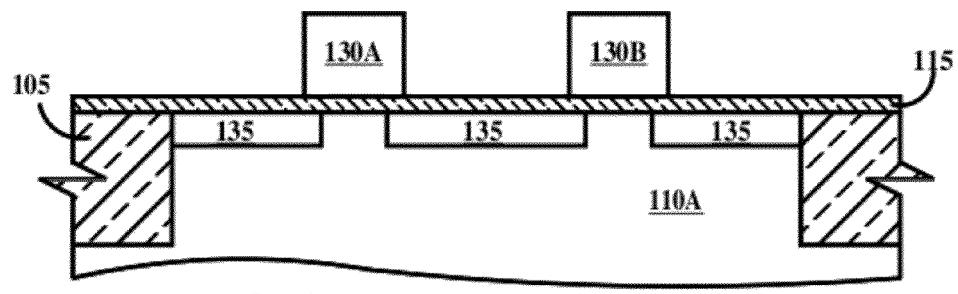

FIG. 6 is a plan view and FIGS. 6A and 6B are cross-sectional views through lines 6A-6A and 6B-6B respectively of FIG. 6. A cross-section through line 6C-61C would be similar to FIG. 6B. In FIGS. 6 and 6B source/drain extensions 135 have been formed in substrate regions 110A and 110B. Source/drain extensions may be formed by an angled (at an acute angle relative to the top surface of substrate 100) ion implantation while substrate 100 is rotating about an axis perpendicular to the top surface of the substrate.

Figure 7:
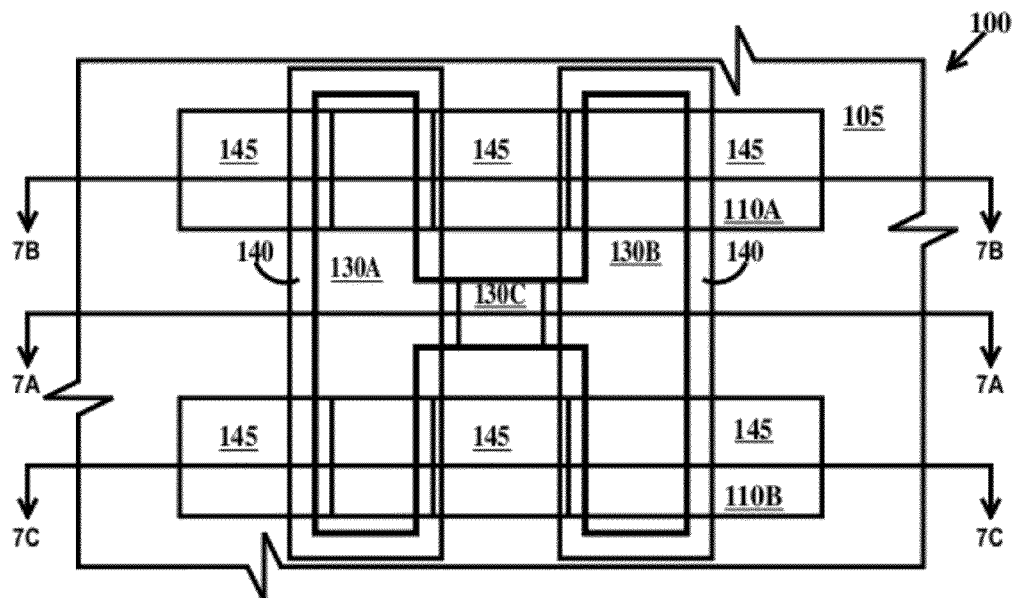
Figure 7A:
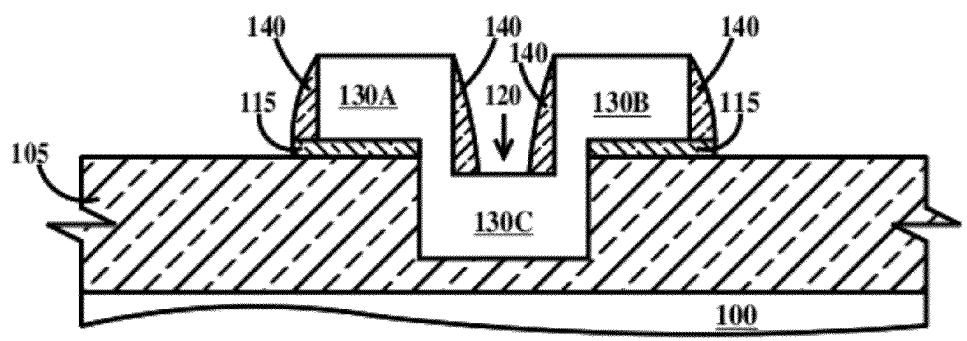
Figure 7B:
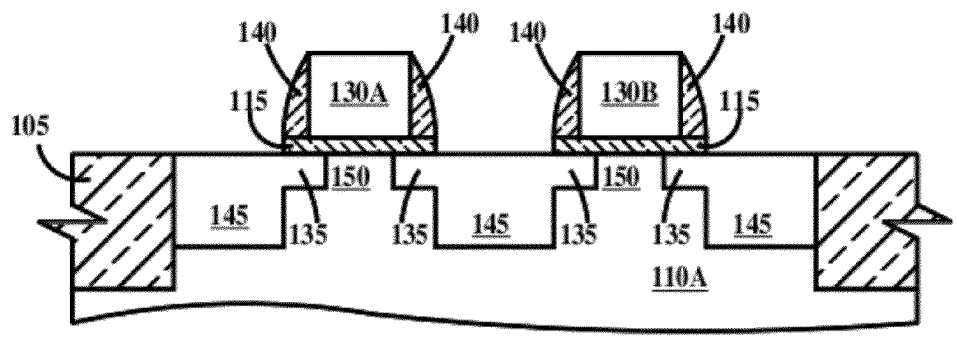

FIG. 7 is a plan view and FIGS. 7A and 7B are cross-sectional views through lines 7A-7A and 7B-7B respectively of FIG. 7. A cross-section through line 7C-7C would be similar to FIG. 7B. In FIGS. 7, 7A and 7B dielectric sidewall spacers 140 have been formed on the sidewalls of gate electrodes 130A and 130B. In one example sidewall spacers comprise $Si_3N_4$. Sidewall spacers 140 may be formed by a blanket deposition of a conformal dielectric layer followed by an RIE to remove the dielectric material from horizontal surfaces (surfaces parallel to the top surface of substrate 100). After sidewall spacer formation, source/drains 145 are formed in substrate regions 110A and 110B, for example, by ion implantation where substrate regions 110A and 110B are not protected by gate electrodes 130A, 130B or sidewall spacers 140. Source/drains 145 include integral source/drain extensions 135. Channel regions 150 of substrate region 110A (and 110B) are defined between source/drain extensions 135 under gate electrodes 130A and 130B. In one example, gate dielectric layer 115 is also removed by the spacer RIE process where the gate dielectric layer is not protected by gate electrodes 130A and 130B or sidewall spacers 140 (as they are formed).

Although, both first and second gate electrodes 130A and 130B are illustrated as extending over both first and second semiconductor regions 110A and 110B and trench isolation, alternatively, first gate electrode 130A may extend only over first semiconductor region 110A and trench isolation 105 and first gate electrode 130A may extend only over first semiconductor region 110A and trench isolation 105 as long as the first and second gate electrodes are joined by strap 130C in trench 120.

Figure 8:
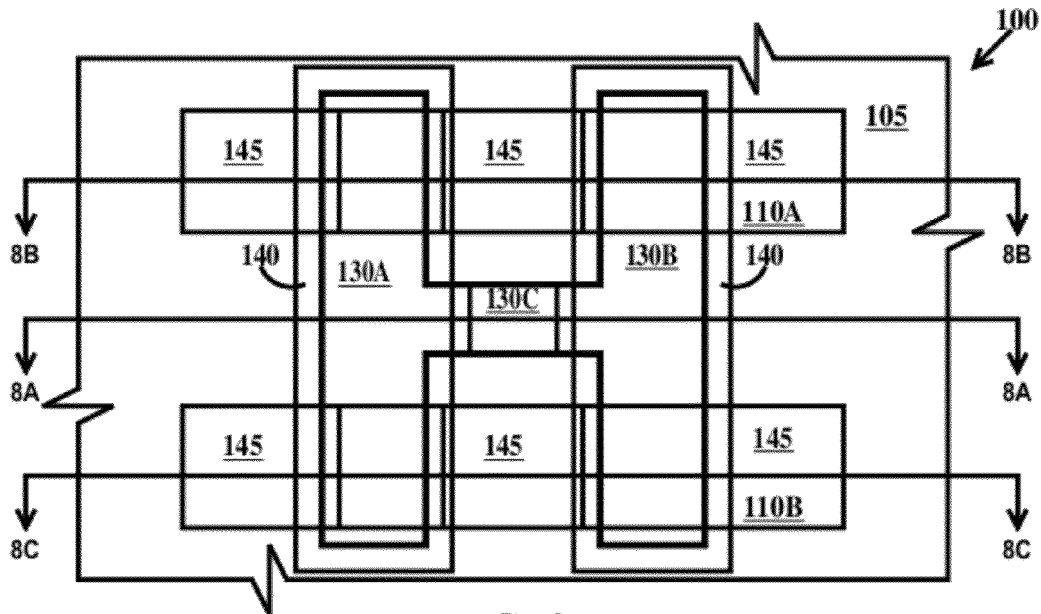
Figure 8A:
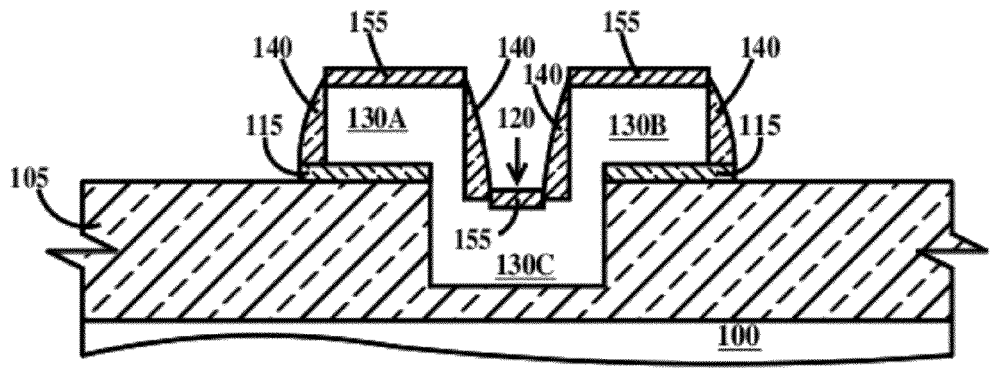
Figure 8B:
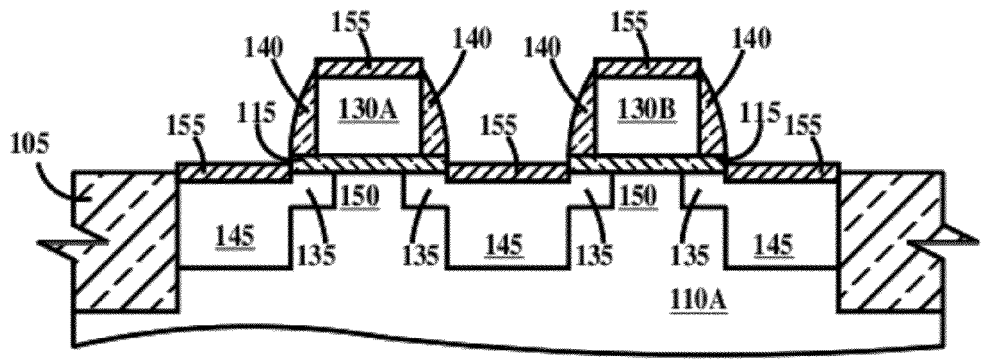

FIG. 8 is a plan view and FIGS. 8A and 8B are cross-sectional views through lines 8A-8A and 8B-8B respectively of FIG. 8. A cross-section through line 8C-8C would be similar to FIG. 8B. In FIGS. 8A and 8B metal silicide layers 155 (when semiconductor regions 110A and 110B include or are silicon) are formed on exposed surfaces of source/drains 145 and gate electrodes 130A and 130B. Metal silicide layers 155 may be formed by depositing a thin metal layer, followed by high temperature heating in an inert or reducing atmosphere at a temperature that will cause the metal to react with silicon followed by an etch to remove un-reacted metal.

Figure 9:
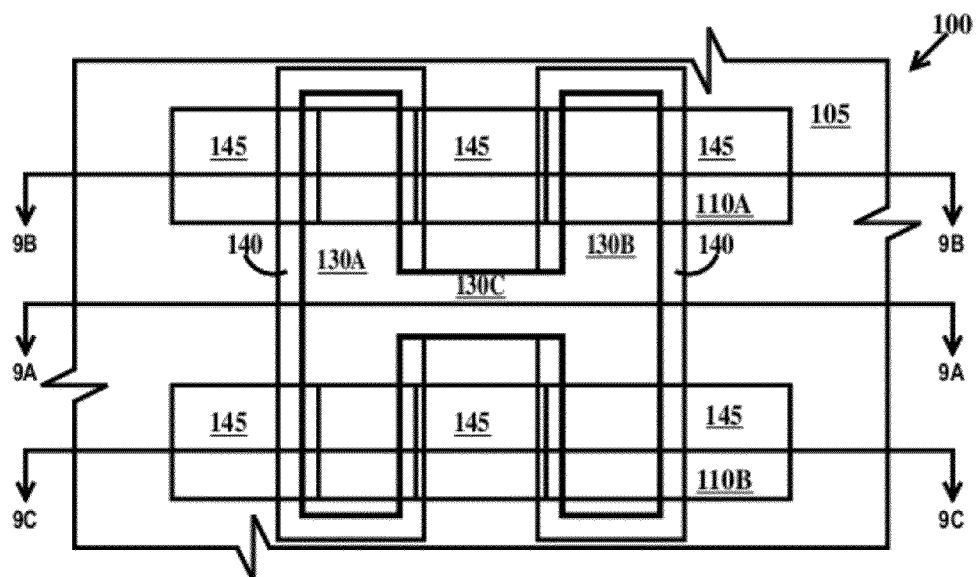
FIG. 9 illustrates an alternative processing sequence for the first method.
Figure 9A:
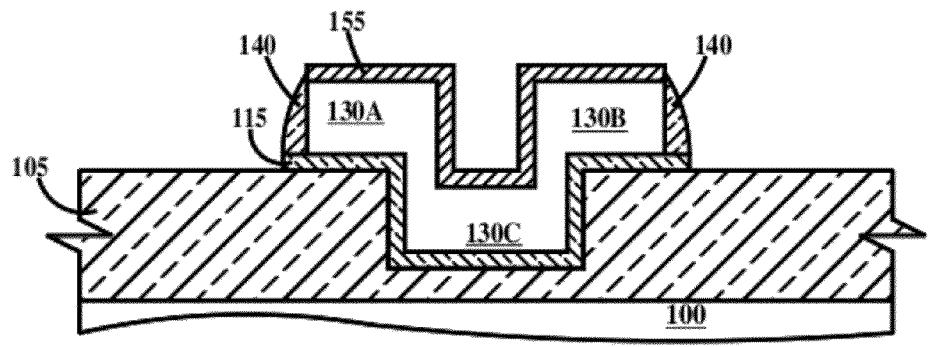
Figure 9B:
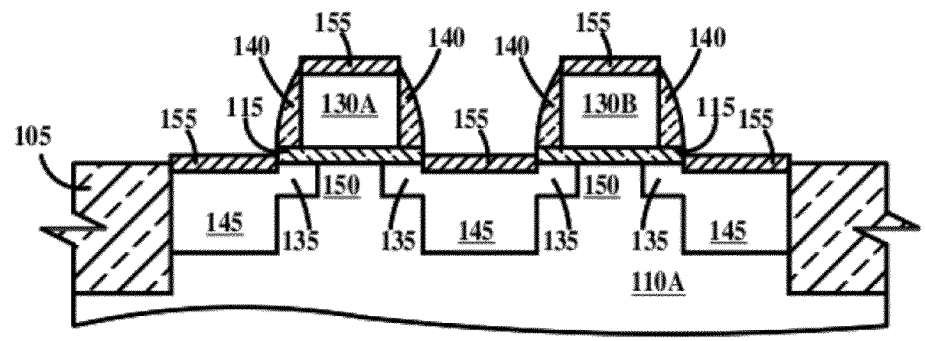

FIG. 9 illustrates two alternative processing sequences for the first method. FIG. 9 is a plan view and FIGS. 9A and 9B are cross-sectional views through lines 9A-9A and 9B-9B respectively of FIG. 9. A cross-section through line 9C-9C would be similar to FIG. 9B. In the first alternative dielectric layer 115 has been formed after forming trench 120 so the bottom and sidewalls of trench 120 are lined with gate dielectric layer 115. In the second alternative, the spacers 140 over strap 130C were removed prior to metal silicide formation resulting in a metal silicide strap 155A connecting gate electrodes 130A and 130B in the vicinity of strap 130C providing enhanced electrical conduction. Either the first alternative may be used alone, the second alternative used alone, both the first and second alternatives used together, or neither the first and second alternatives used.

Figure 10:
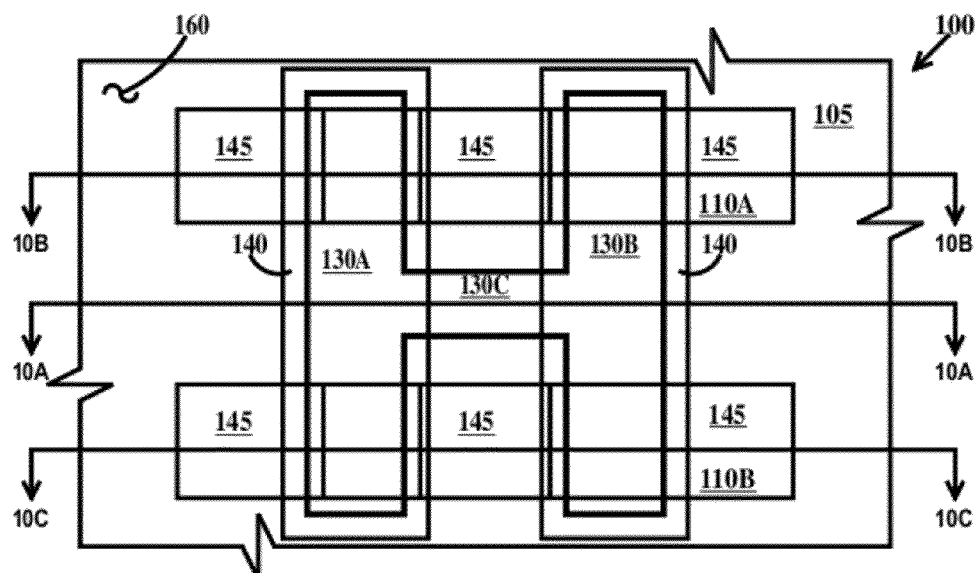
FIGS. 10 through 13 illustrate a second method of fabricating a gate-to-gate strap according to an embodiment of the present invention.
Figure 10A:
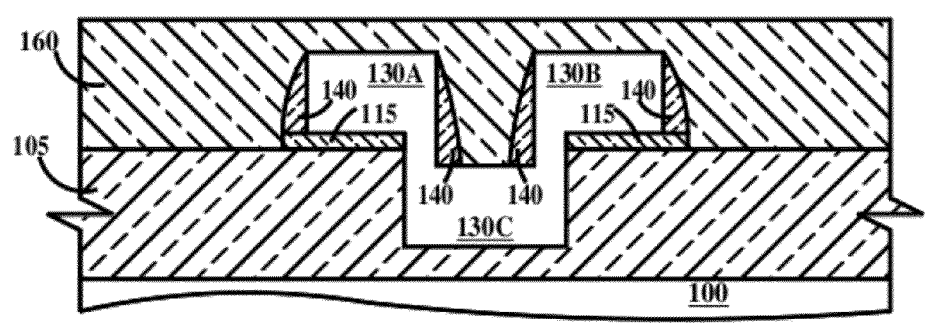
Figure 10B:
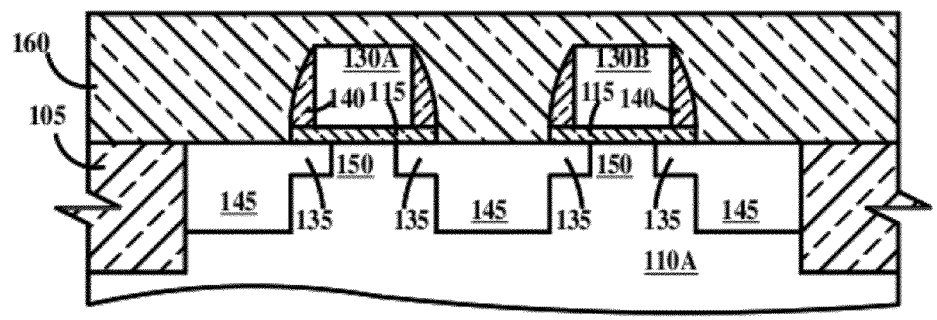

FIGS. 10 through 13 illustrate a second method of fabricating a gate-to-gate strap according to an embodiment of the present invention. FIG. 10 is a plan view and FIGS. 10A and 10B are cross-sectional views through lines 10A-10A and 10B-10B respectively of FIG. 10. A cross-section through line 10C-10C would be similar to FIG. 10B. FIGS. 10, 10A and 10B are performed after the steps illustrated in FIGS. 1 through 7 have been performed. In FIGS. 10, 10A and 10B an interlevel dielectric layer (ILD) 160 has been deposited over substrate 100.

Figure 11:
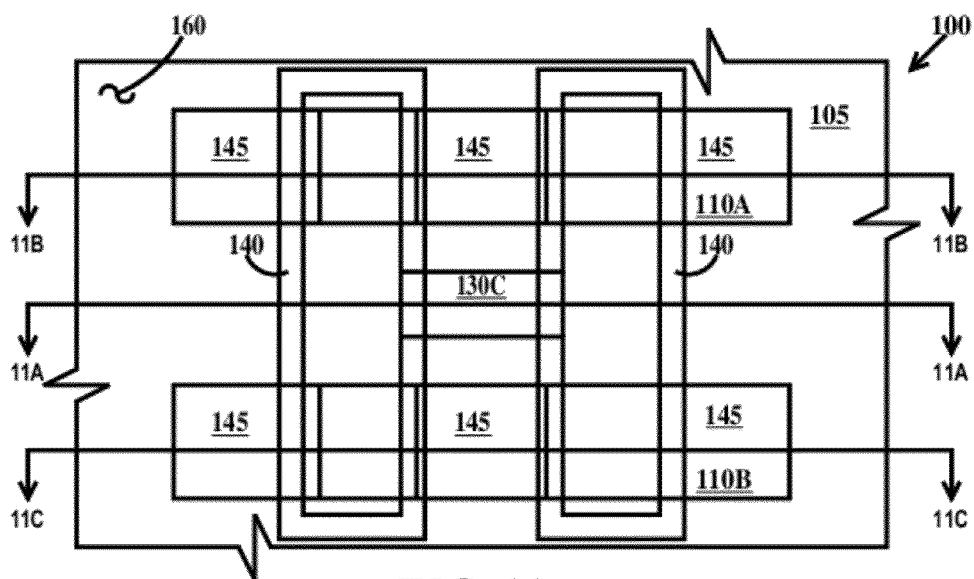
Figure 11A:
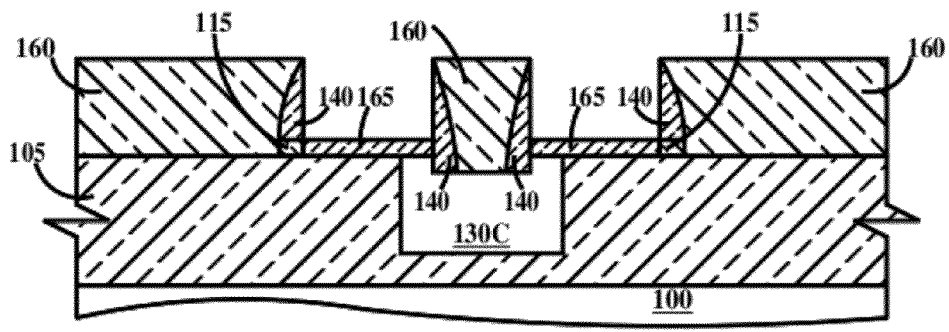
Figure 11B:
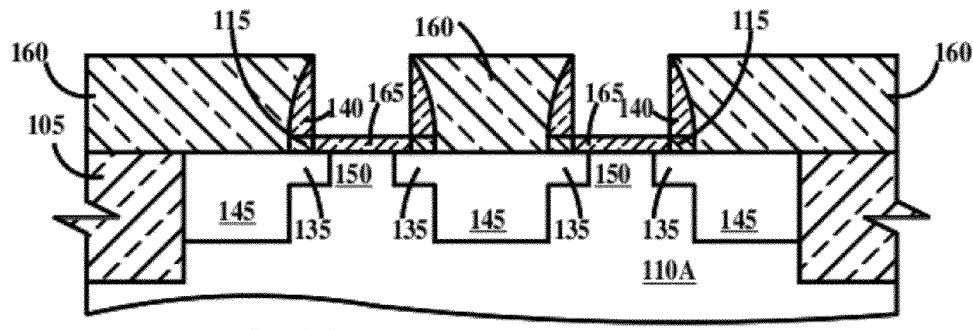

FIG. 11 is a plan view and FIGS. 11A and 11B are cross-sectional views through lines 11A-11A and 11B-11B respectively of FIG. 11. A cross-section through line 11C-11C would be similar to FIG. 11B. In FIGS. 11, 11A and 11B, a CMP has been performed to expose the top surfaces of gate electrodes 130A and 130B (see FIGS. 10A and 10B). Next gate electrodes 130A and 130C and gate dielectric layer 115 (see FIGS. 10A and 10B) are removed and a replacement gate dielectric layer 165 has been formed in place of gate dielectric layer 115 where the gate dielectric layer 115 was not protected by sidewall spacers 140. When a gate electrode (i.e., 130A or 130B) is used in this manner, it often called a dummy gate electrode. When a gate dielectric layer (i.e., 115) is used in this manner, it is often called a dummy gate dielectric layer. When the dummy gates are polysilicon, they may be removed by using wet or dry etching processes, for instance, a wet etch process using tetramethyl ammonium hydroxide (TMAH) or ammonium hydroxide ($NH_4OH$), or a fluorine based RIE process. In the example that dummy gate dielectric is $SiO_2$, the dummy gate electrode may be removed by a fluorine based RIE or a dilute HF etch. In one example, gate dielectric layer 165 comprises $SiO_2$, silicon nitride ($Si_3N_4$) or combinations of layers thereof. In one example gate dielectric layer 165 is a high-K (dielectric constant) material, examples of which include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. In one example, gate dielectric layer 165 is about 0.5 nm to about 20 nm thick.

Figure 12:
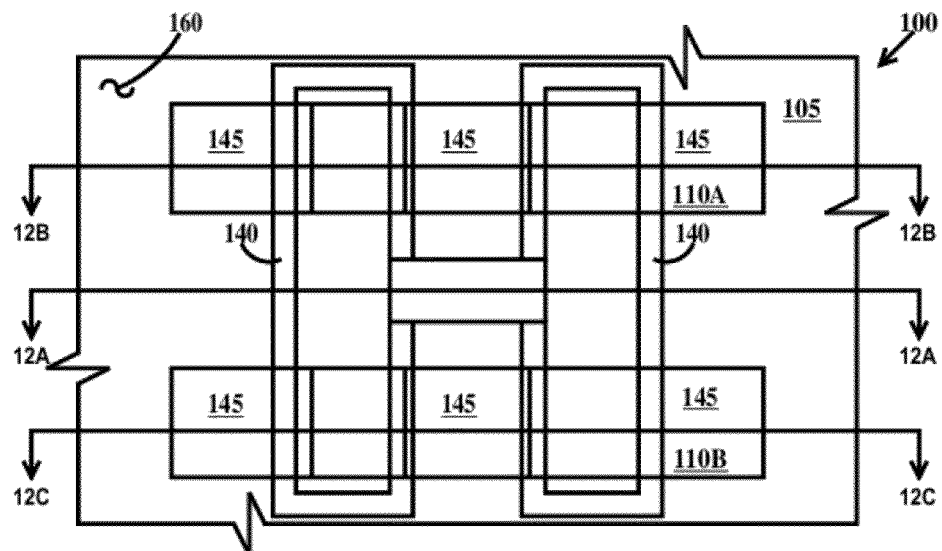
Figure 12A:
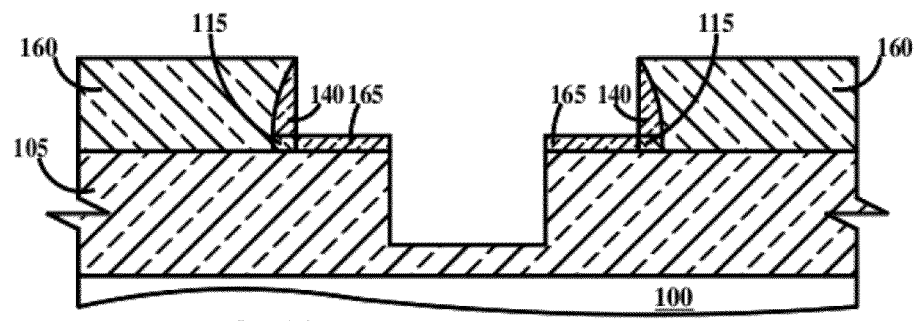
Figure 12B:
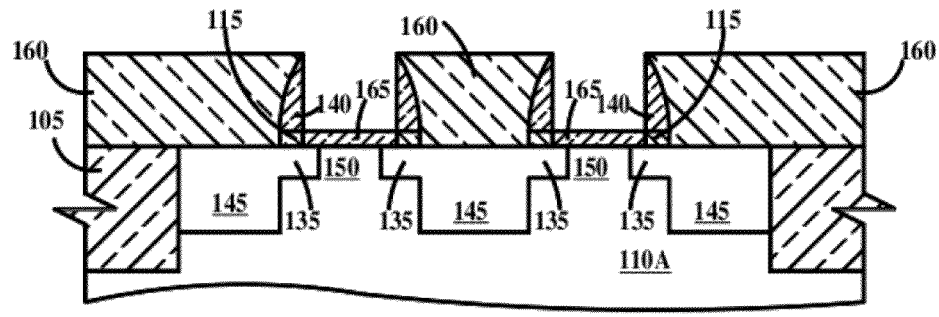

FIG. 12 is a plan view and FIGS. 12A and 12B are cross-sectional views through lines 12A-12A and 12B-12B respectively of FIG. 12. A cross-section through line 12C-12C would be similar to FIG. 12B. In FIGS. 12 and 12A ILD 160, sidewall spacers 140 over gate strap 130C and gate strap 130C (see FIG. 11A) are removed by, for example, combinations of wet and RIE etches. In this example, strap 130C (see FIG. 11A) may be considered a dummy strap.

Figure 13:
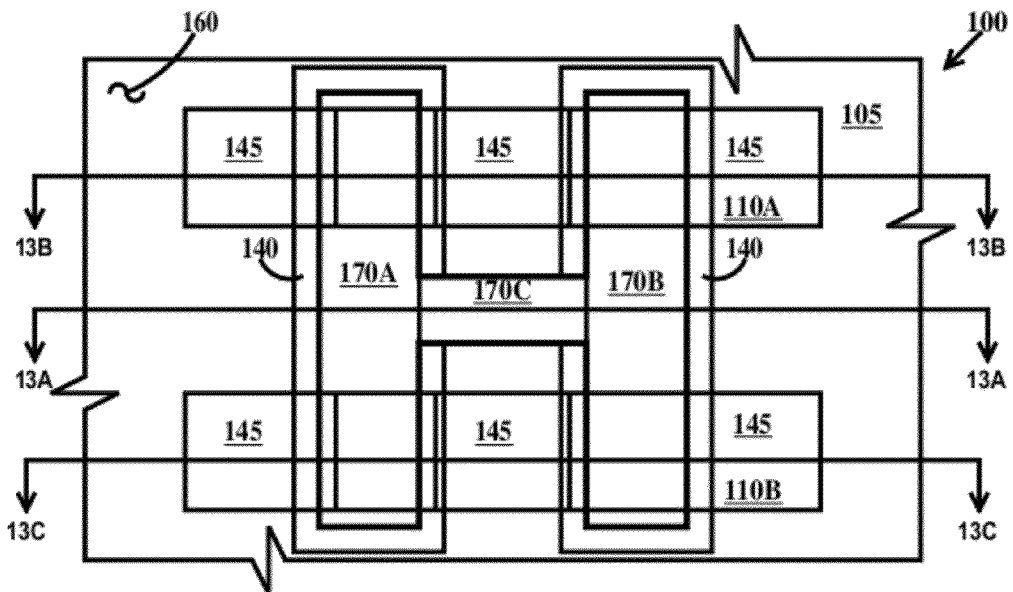
Figure 13A:
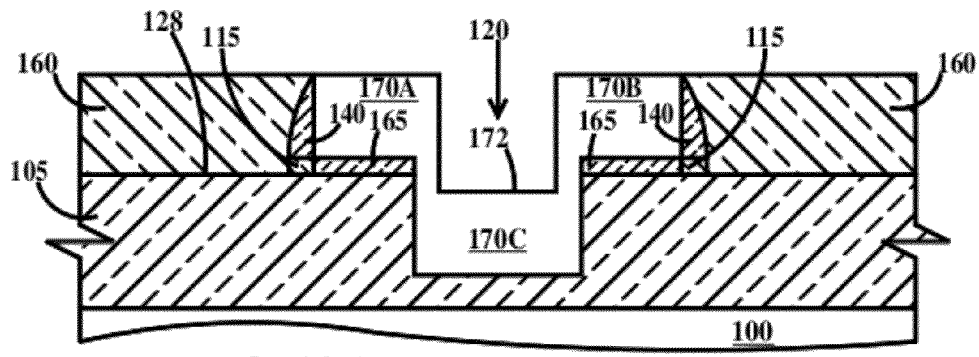
Figure 13B:
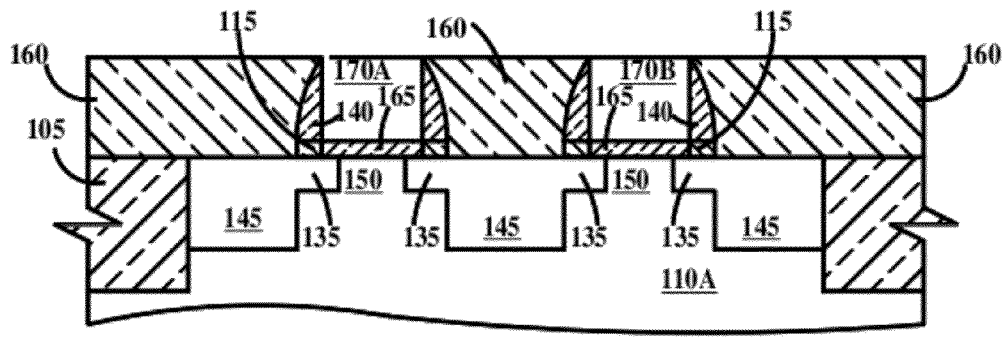

FIG. 13 is a plan view and FIGS. 13A and 13B are cross-sectional views through lines 13A-13A and 13B-13B respectively of FIG. 13. A cross-section through line 13C-13C would be similar to FIG. 13B. In FIGS. 13 and 13A first and second replacement gates 170A and 170B and replacement strap 170C are formed. Replacement gates 170A and 170B and replacement strap 170C are integrally formed. In one example, replacement gates 170A and 170B and replacement strap 170C comprise aluminum. Replacement gates 170A and 170B and replacement strap 170C may be formed, for example, by atomic layer deposition (ALD), CVD, plasma vapor deposition (PVD), electroplating (EP), and electroless plating (EL). A thin aluminum seed layer may be first formed by evaporative deposition prior to ALD, CVD, PVD, EP and EL. In a preferred embodiment, a top surface 172 of strap 170C in trench 120 is recessed below a top surface of 128 of trench isolation 105. Alternatively, top surfaces 172 and 128 may be coplanar or top surface 172 may extend above top surface 128.

Although, both first and second gate electrodes 170A and 170B are illustrated as extending over both first and second semiconductor regions 110A and 110B and trench isolation, alternatively, first gate electrode 170A may extend only over first semiconductor region 110A and trench isolation 105 and first gate electrode 170A may extend only over first semiconductor region 110A and trench isolation 105 as long as the first and second gate electrodes are joined by strap 170C in trench 120.

Figure 14:
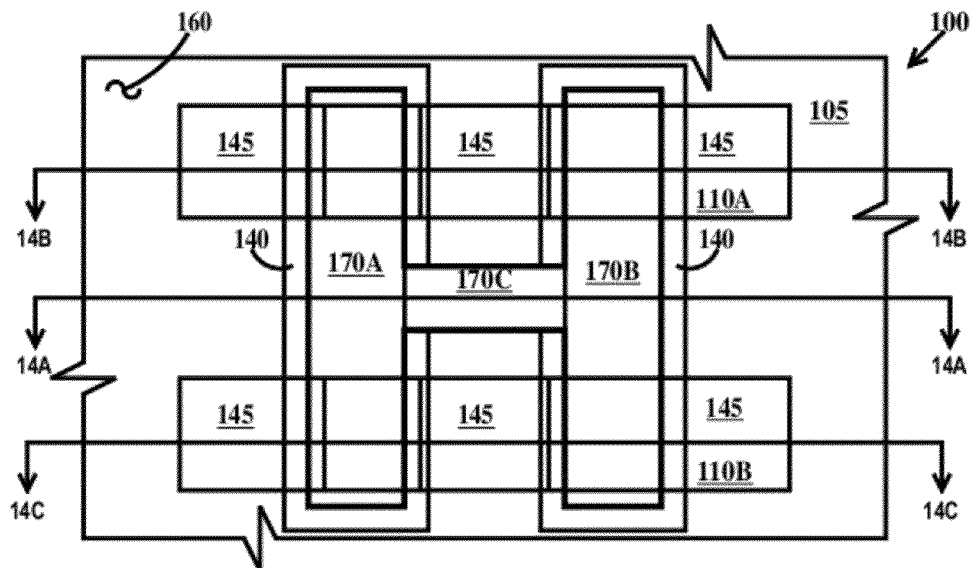
FIG. 14 illustrates an alternative processing sequence for the second method.
Figure 14A:
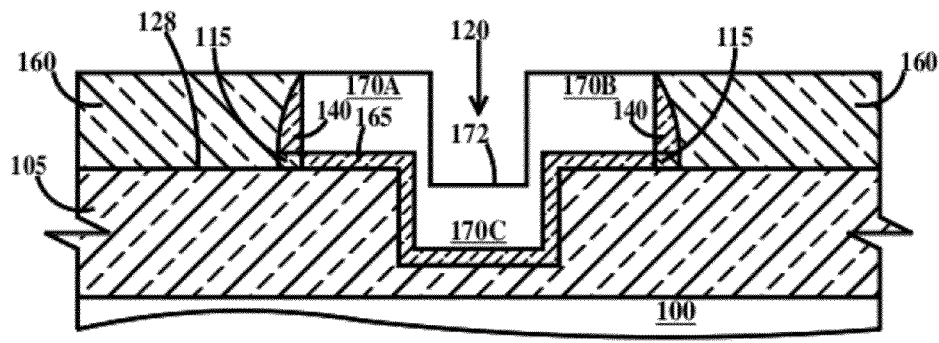
Figure 14B:
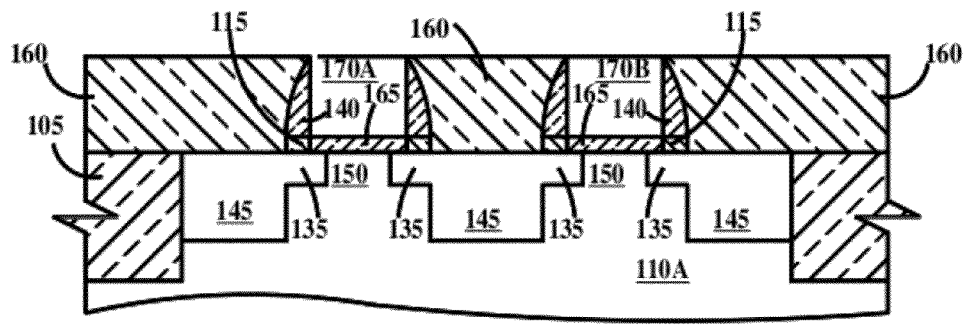

FIG. 14 illustrates an alternative processing sequence for the second method. FIG. 14 is a plan view and FIGS. 14A and 14B are cross-sectional views through lines 14A-14A and 14B-14B respectively of FIG. 14. A cross-section through line 14C-14C would be similar to FIG. 14B. In the alternative processing sequence, dielectric layer 165 has been formed after removing ILD 160 and sidewall spacers 140 over gate strap 130C (see FIG. 11A) and forming replacement gate electrodes 170A and 170B and strap 170C.

Thus the embodiments of the present invention provide a recessed strap for interconnecting two or more gates of adjacent MOSFETs, reducing the need for interconnecting the gates at a higher interconnect level.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   first and second semiconductor regions in a semiconductor substrate and separated by a region of trench isolation in said substrate;
   a first gate electrode extending over said first semiconductor region and said region of said trench isolation;
   a second gate electrode extending over said second silicon region and said region of said trench isolation;
   a trench in said trench isolation; and
   a strap in said trench connecting said first and second gate electrodes.

2. The structure of claim 1, wherein said first and second gate electrodes and said strap are integrally formed.

3. The structure of claim 1, further including:
   said first and second gate electrodes extending across said trench and partially filling said trench.

4. The structure of claim 1, wherein said first and second gate electrodes and said strap comprise polysilicon.

5. The structure of claim 1, further including:
   a metal silicide layer on said first and second gate electrodes and said strap.

6. The structure of claim 1, wherein said first and second gate electrodes and said strap comprise a metal.

7. The structure of claim 1, further including:
   a first gate dielectric layer between said first gate electrode and said first semiconductor region and a second gate dielectric layer between said second gate dielectric layer and said second semiconductor region; and
   first source/drains in said first region on opposite sides of first gate electrode and second source/drains in said second region on opposite sides of second gate electrode.

8. The structure of claim 1, further including:
   a gate dielectric layer between said first gate electrode and said first semiconductor region and between said second gate dielectric layer and said second semiconductor region; and
   said gate dielectric layer lining sidewalls and a bottom of said trench.

9. The structure of claim 1, wherein a top surface of said strap is recessed below a top surface of said trench isolation.

10. The structure of claim 1, wherein:
    first major axes of said first and second gate electrodes are parallel;
    second major axes of said first and second semiconductor regions and said strap are parallel; and
    said first and second major axes are perpendicular.

11. A method, comprising:
    forming a first and a second semiconductor regions in a semiconductor substrate and separated by a region of trench isolation in said substrate;
    forming a trench in said trench isolation; and
    forming a first gate electrode extending over said first semiconductor region and said region of said trench isolation, an integral second gate electrode extending over said second silicon region and said region of said trench isolation, and an integral strap in said trench, said strap connecting said first and second gate electrodes.

12. The method of claim 11, further including:
    forming sidewall spacers on sides of said first and second gate electrodes; and
    forming first source/drains in said first region on opposite sides of first gate electrode and forming second source/drains in said second region on opposite sides of second gate electrode.

13. The method of claim 11, further including:
    forming a metal silicide on top surfaces of said first and second gate electrodes and on said strap.

14. The method of claim 11, further including:
    forming a gate dielectric layer over said first and second silicon regions, said trench isolation and in said trench.

15. The method of claim 11, further including:
    forming a gate dielectric layer over said first and second silicon regions, said trench isolation and in said trench.
    removing said gate dielectric layer from said trench.

16. The method of claim 12, further including:
    removing said sidewall spacers from said first and second gate electrodes in said trench; and
    forming a metal silicide on top surfaces of said first and second gate electrodes and on said strap.

17. A method comprising:
    forming first and second semiconductor regions in a semiconductor substrate and separated by a region of trench isolation in said substrate;

forming a first trench in said trench isolation;

forming a dummy structure comprising a first dummy gate electrode extending over said first semiconductor region and said region of said trench isolation, an integral second dummy gate electrode extending over said second silicon region and said region of said trench isolation, and an integral dummy strap in said first trench, said dummy strap connecting said first and second dummy gate electrodes; and removing said dummy structure and replacing said dummy structure with a first gate electrode, an integral second gate electrode and an integral dummy strap.

18. The method of claim 17, further including:

forming sidewall spacers on sides of said first and second dummy gate electrodes;

forming first source/drains in said first region on opposite sides of first dummy gate electrode and forming second source/drains in said second region on opposite sides of second dummy gate electrode;

forming an interlevel dielectric layer over said substrate, a top surface of said interlayer dielectric layer coplanar with top surfaces of said first and second dummy gates;

removing regions of said sidewall spacers and a region of said interlevel dielectric layer from over said first trench;

wherein said removing said first and second dummy gates and said dummy strap forms second and third trenches in said interlevel dielectric layer; and filling said first and second and third trenches with a layer of electrically conductive material to form said first and second gate electrodes connected by said strap in said first trench.

19. The method of claim 17, further including:

before forming said first and second dummy gate electrodes, forming a dummy gate dielectric layer over said first and second silicon regions and said trench isolation and in said trench; and after removing said first and second dummy gates, removing said dummy gate dielectric layer from said gate dielectric layer from said first and second and third trenches and forming a gate dielectric layer in said second and third trenches.

20. The method of claim 17, further including:

before forming said first and second dummy gate electrodes, forming a dummy gate dielectric layer over said first and second silicon regions and said trench isolation and in said trench; and after removing said first and second dummy gates, removing said dummy gate dielectric layer from said gate dielectric layer from said first and second and third trenches and forming a gate dielectric layer in said first, second and third trenches.

* * * * *